(12) United States Patent
Maeda et al.

(10) Patent No.: US 6,799,282 B2
(45) Date of Patent: Sep. 28, 2004

(54) POWER GENERATING MECHANISM THAT HAS A DUCT, HEAT PIPE, OR HEAT SINK TO EFFICIENTLY DIFFUSE HEAT GENERATED BY A HEAT

(75) Inventors: Kazuhiko Maeda, Yokohama (JP); Hideto Horikoshi, Sagamihara (JP)

(73) Assignee: International Business Machines Corporation, Armonk, NY (US)

(*) Notice: Subject to any disclaimer, the term of this patent is extended or adjusted under 35 U.S.C. 154(b) by 564 days.

(21) Appl. No.: 09/815,800

(22) Filed: Mar. 23, 2001

(65) Prior Publication Data

US 2001/0023591 A1 Sep. 27, 2001

(30) Foreign Application Priority Data

Mar. 24, 2000 (JP) ......................................... 2000-084839

(51) Int. Cl.[7] .......................... G06F 1/04; H01L 35/30; H01L 35/34; F25B 21/00
(52) U.S. Cl. ........................ 713/500; 136/205; 136/201; 62/3.2
(58) Field of Search ................................. 136/205, 201, 136/250; 126/110; 290/1; 307/117; 713/500

(56) References Cited

U.S. PATENT DOCUMENTS

| 5,419,780 | A | * | 5/1995 | Suski ........................ 136/205 |
| 5,427,086 | A | * | 6/1995 | Brownell ................. 126/110 R |
| 5,921,087 | A | * | 7/1999 | Bhatia et al. .................. 62/3.2 |
| 6,028,263 | A | * | 2/2000 | Kobayashi et al. ......... 136/201 |
| 6,066,902 | A | * | 5/2000 | Maurio et al. .............. 307/117 |
| 6,143,975 | A | * | 11/2000 | Liao et al. ................... 136/201 |
| 6,288,321 | B1 | * | 9/2001 | Fleurial et al. ............. 136/205 |
| 6,335,572 | B1 | * | 1/2002 | Uno et al. ................... 290/1 R |
| 6,340,787 | B1 | * | 1/2002 | Simeray et al. ............. 136/201 |
| 6,388,185 | B1 | * | 5/2002 | Fleurial et al. ............. 136/205 |

* cited by examiner

*Primary Examiner*—Thomas Lee
*Assistant Examiner*—Chi Whan Chung
(74) *Attorney, Agent, or Firm*—Carlos Munoz-Bustamante; Joseph T. Van Leeuwen

(57) ABSTRACT

In a power generating mechanism, a heat sink is mounted on a CPU of a notebook PC to diffuse heat generated by the CPU. A Seebeck element module is mounted in the heat sink to cause a large difference in temperature based on heat emitted from the heat sink and ventilation carried out by a fan unit. Electromotive force obtained from the Seebeck element module is used to drive selected components of the notebook PC.

8 Claims, 11 Drawing Sheets

[Figure 1]
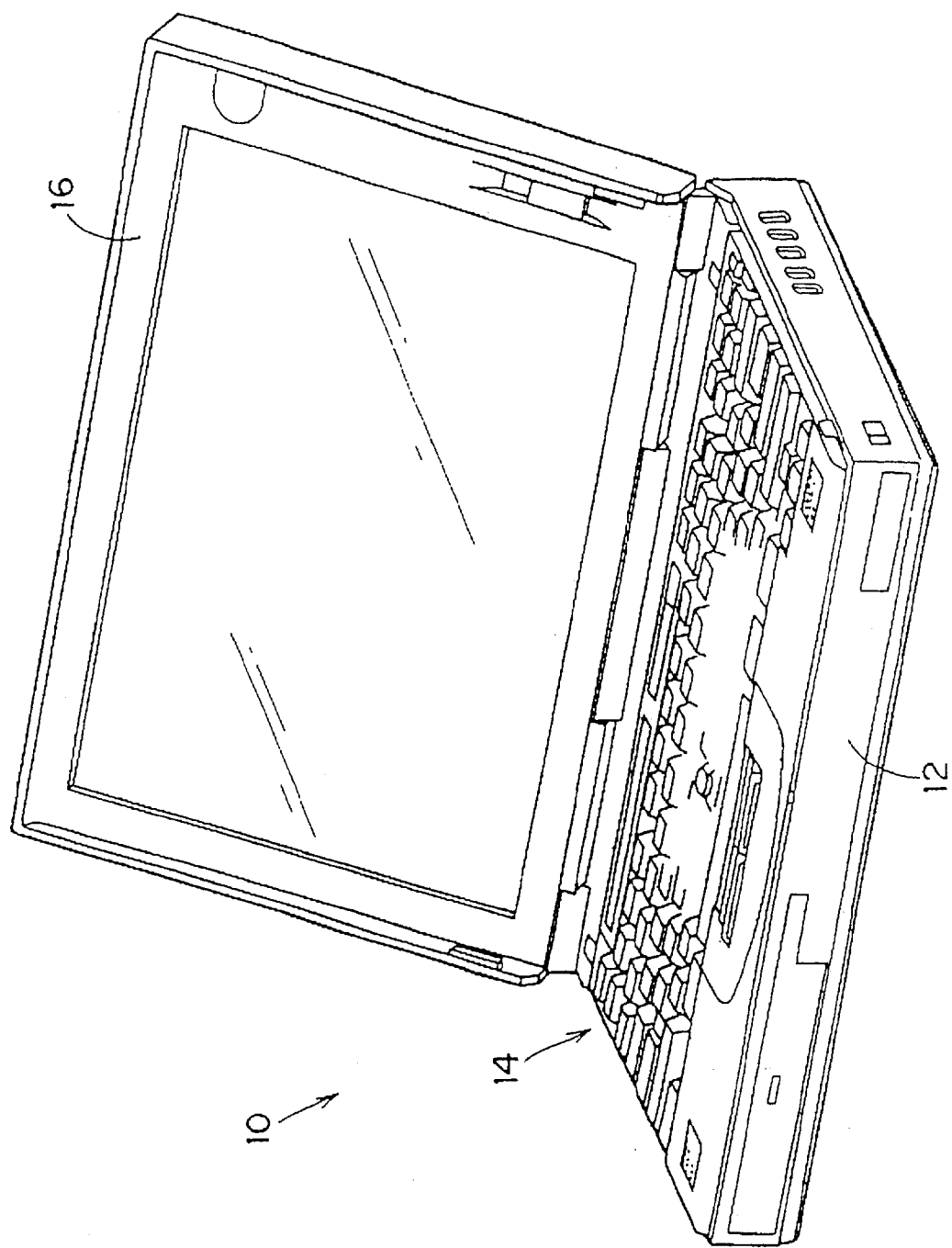

[Figure 2]
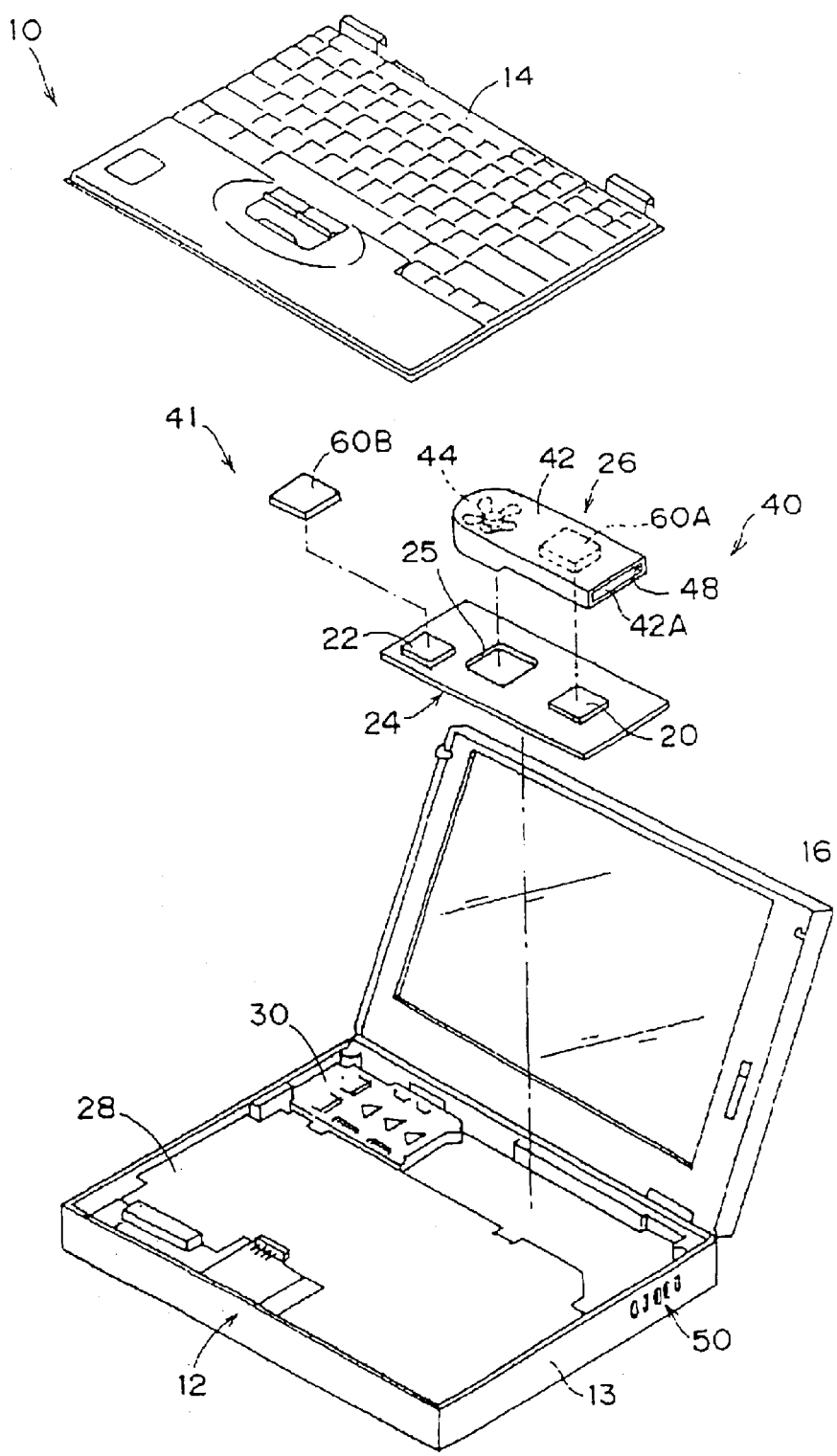

[Figure 3]
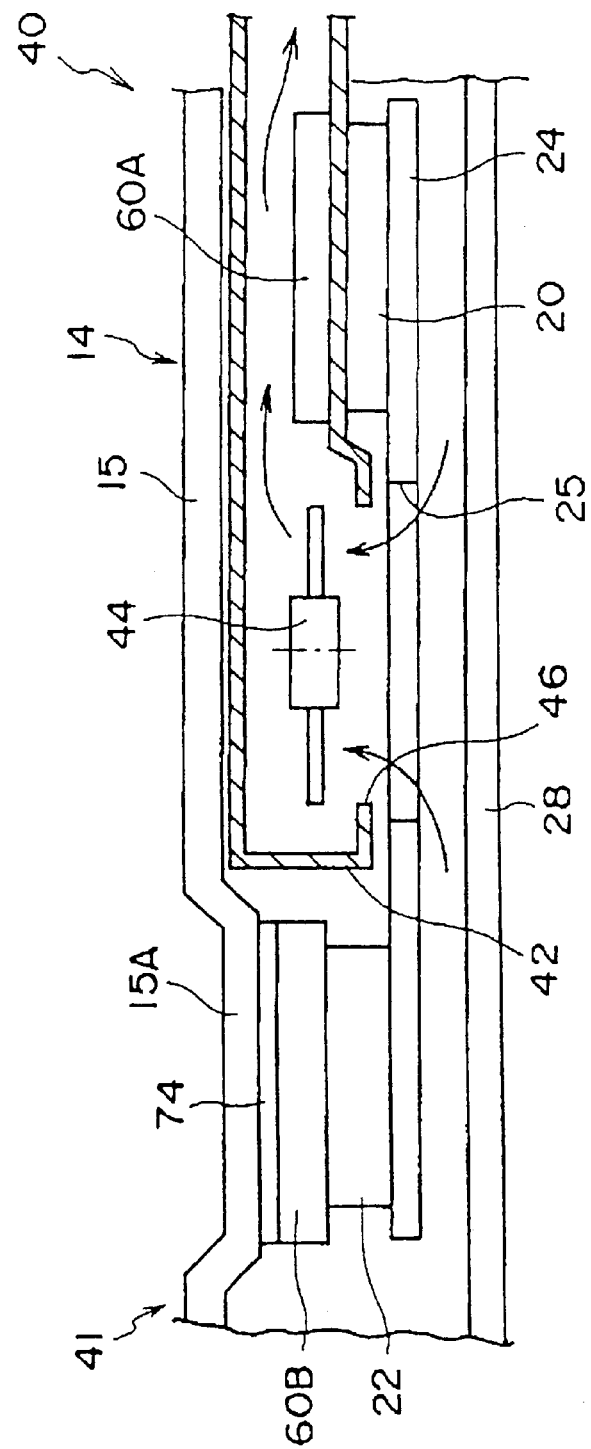

[Figure 4]
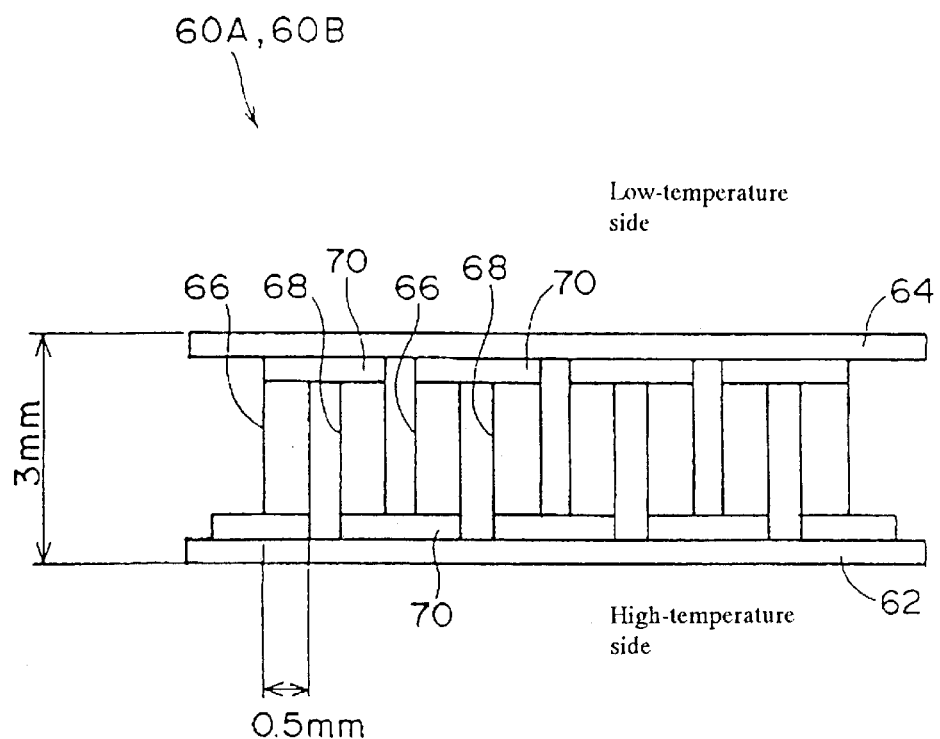

[Figure 5]
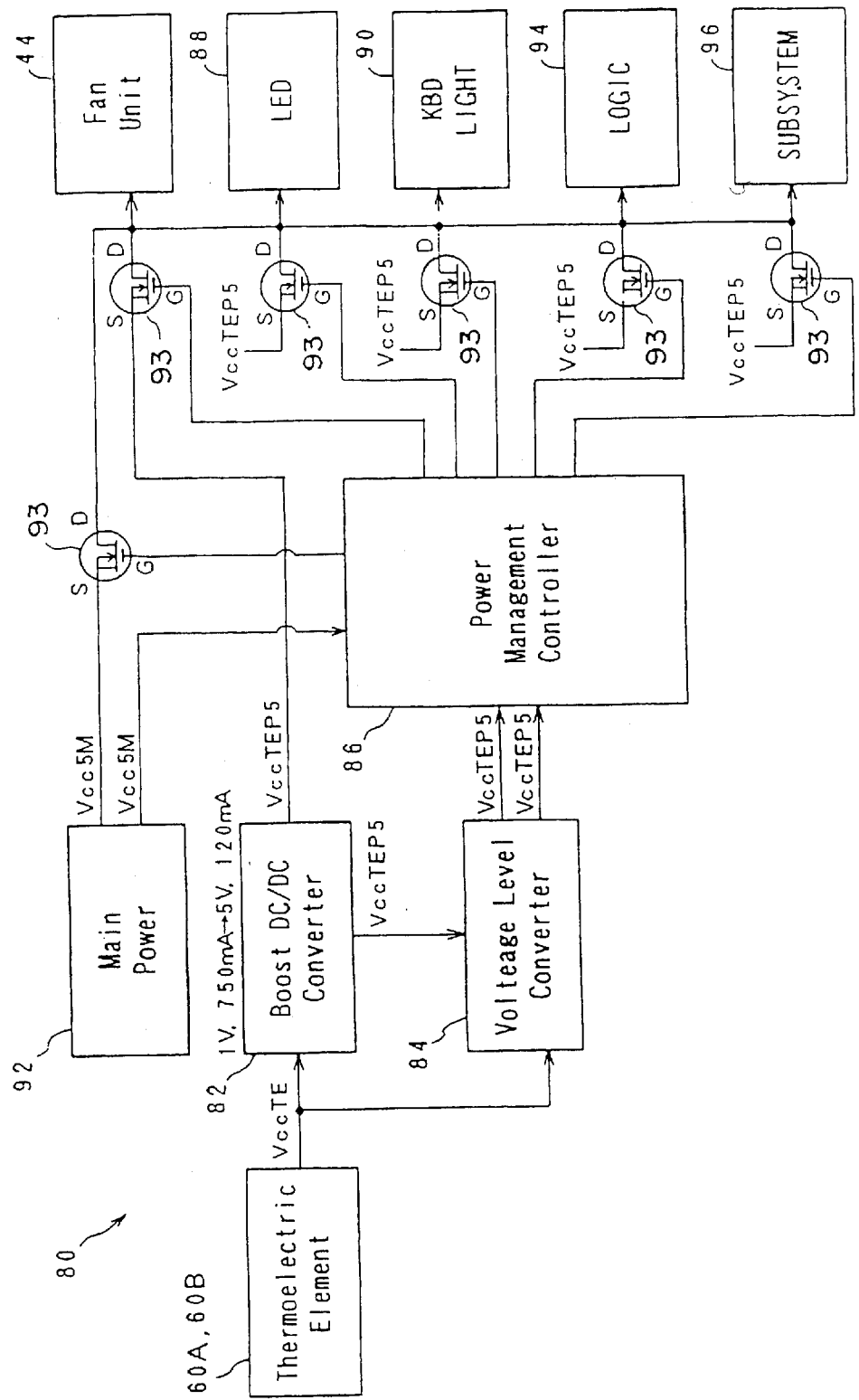

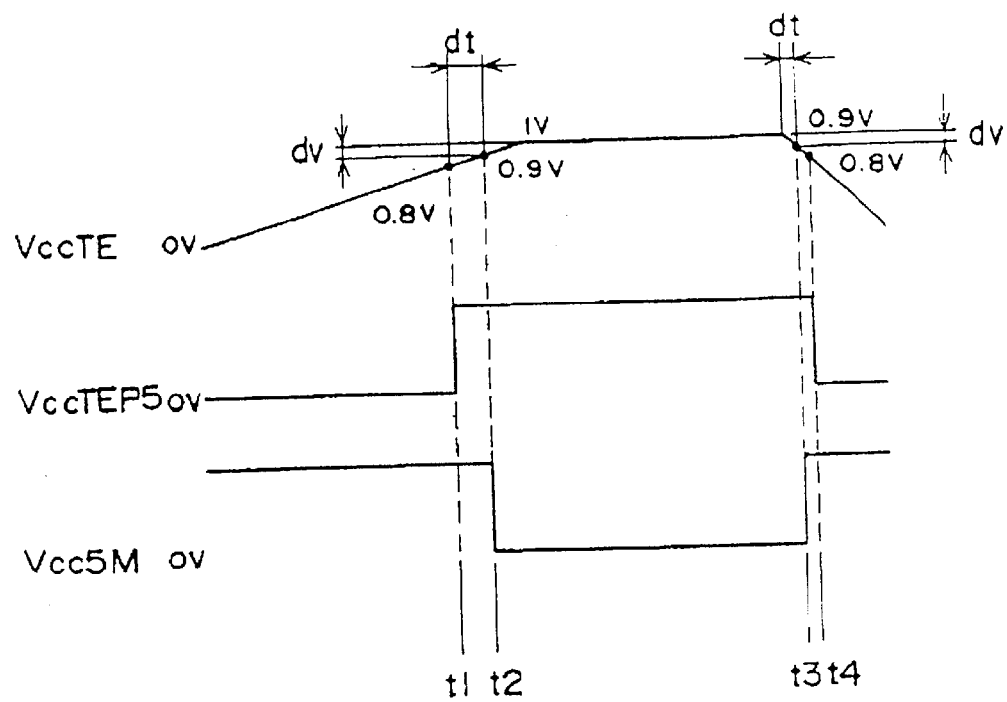
[Figure 6]

[Figure 7]
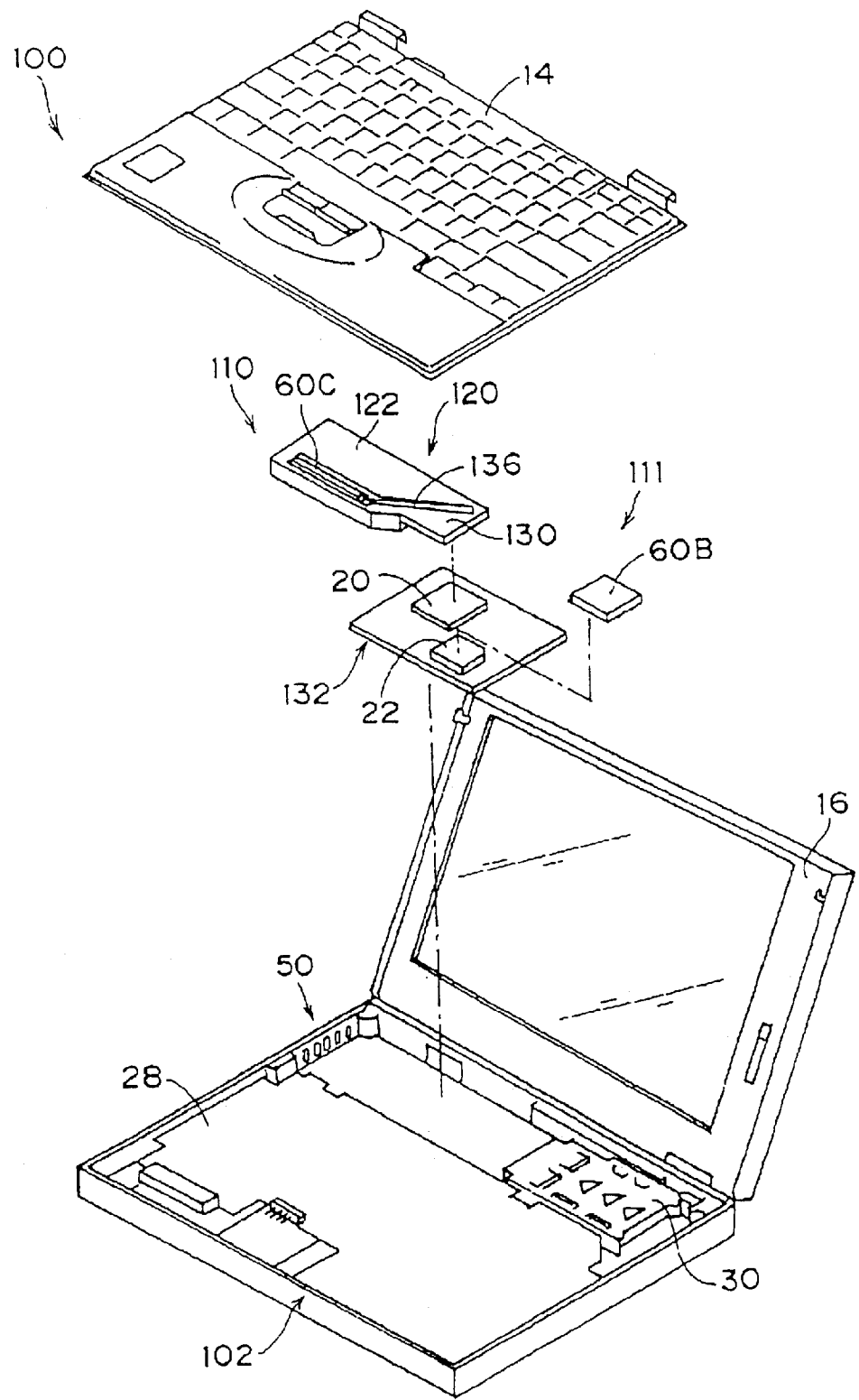

[Figure 8]
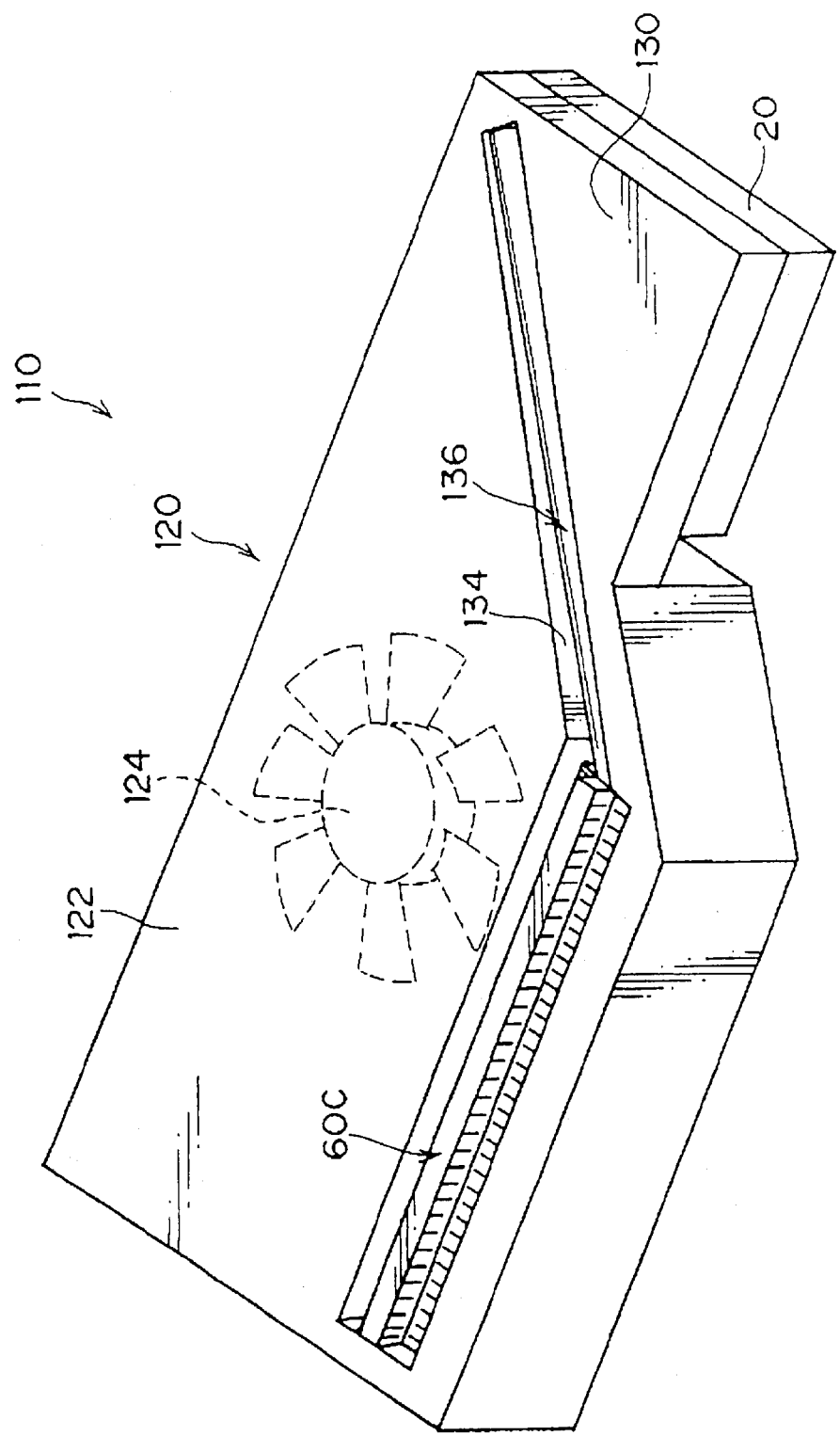

[Figure 9]
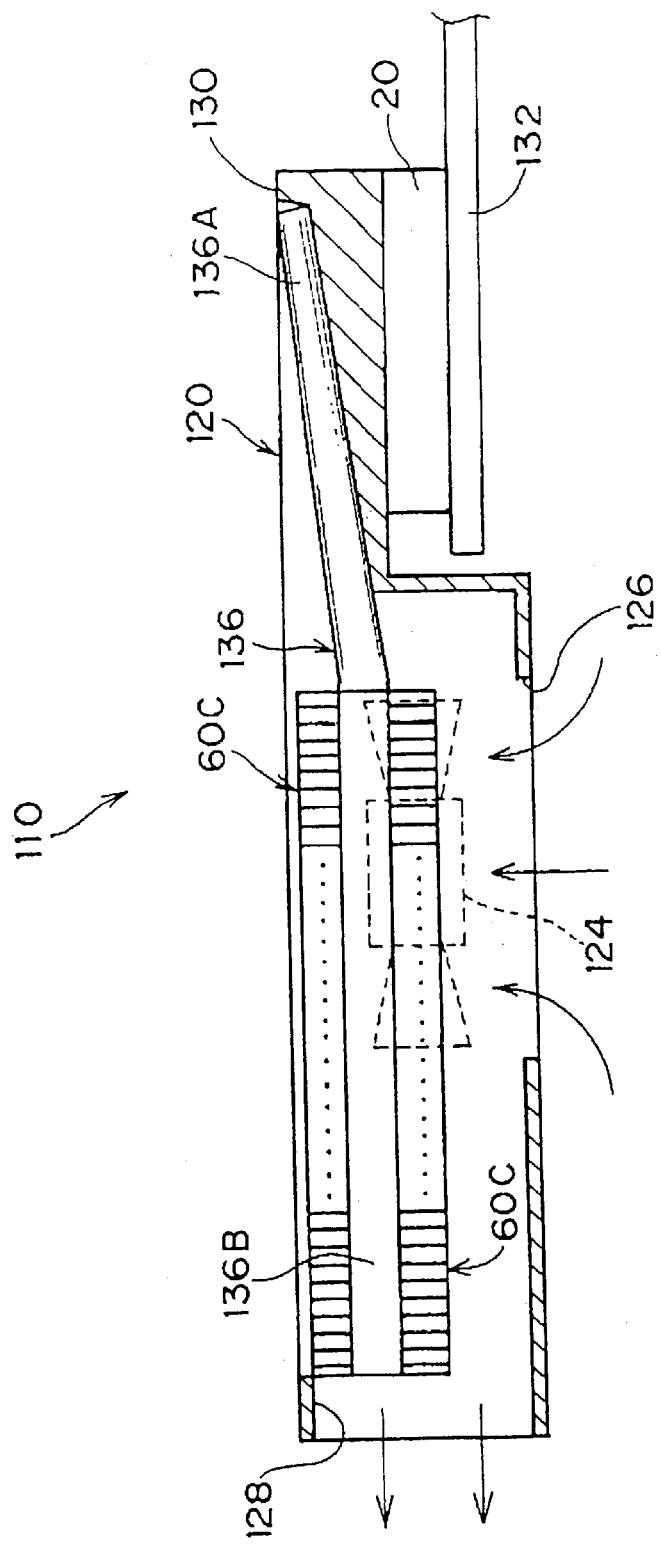

[Figure 10]
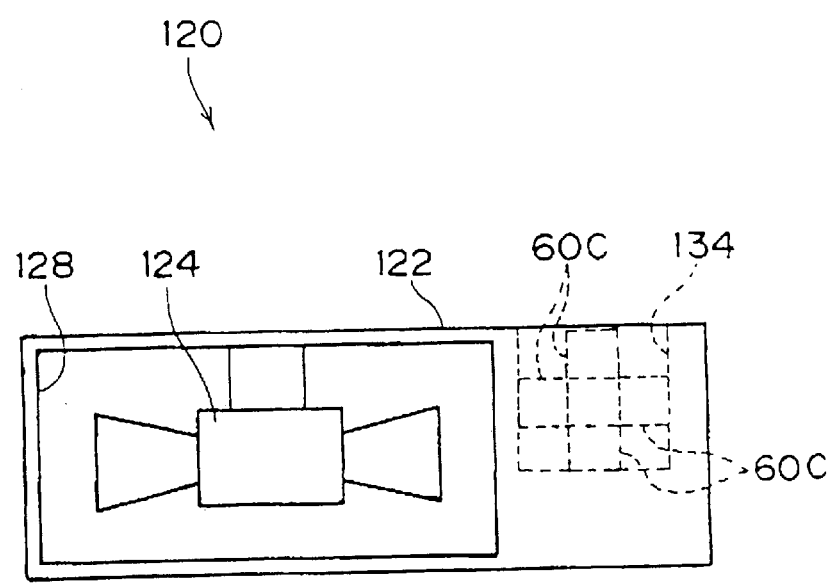

[Figure 11]
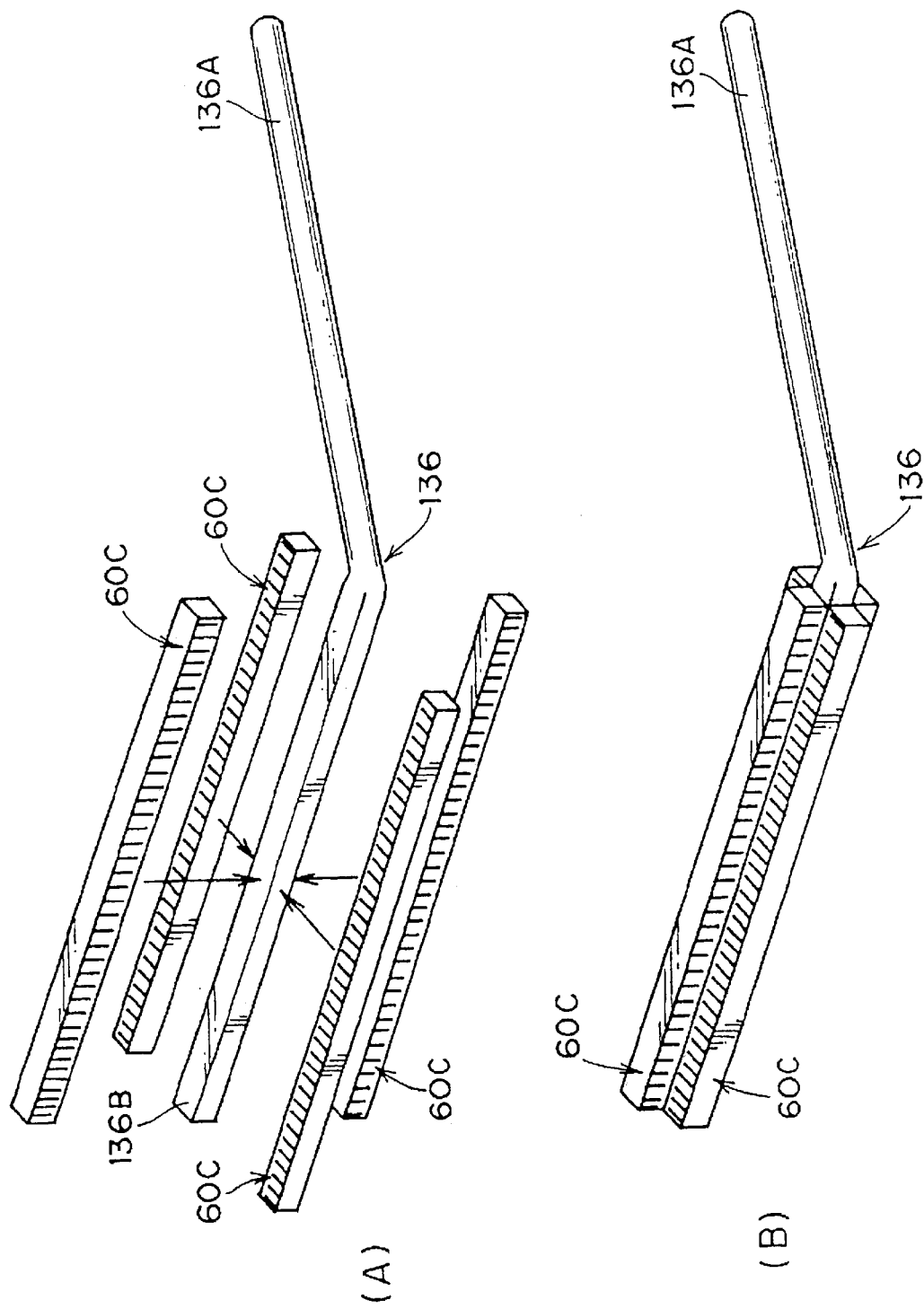

POWER GENERATING MECHANISM THAT HAS A DUCT, HEAT PIPE, OR HEAT SINK TO EFFICIENTLY DIFFUSE HEAT GENERATED BY A HEAT

FIELD OF THE INVENTION

The present invention relates generally to a power generating mechanism for use in electronic apparatus and in particular to a power generating mechanism for generating power using heat generated by a heat generating component provided in an electronic apparatus such as a computer.

BACKGROUND OF THE INVENTION

There has been a strong demand for a reduction in power consumption of electronic equipment due to environmental and ecological concerns. In addition, energy efficiency in terms of performance vs. power consumption is important to battery-driven portable equipment or the like, and is directly related to the amount of time available to operate the equipment. Thus, efforts are being made to further reduce power consumption. One way of doing this is to improve efficiency by reusing lost energy in equipment.

For example, notebook personal computers have a large amount of energy lost therefrom as heat because a semiconductor device therein such as a CPU or an electric circuit therein becomes hot. Further, many pieces of equipment include what is called a CPU cooler for preventing the CPU from malfunctioning due to heat, and excess power is consumed to drive a ventilation fan of the CPU cooler.

Techniques for generating power using heat generated by a heat generating component have been developed, as disclosed, for example, in U.S. Pat. No. 5,921,087. According to this patent, power is obtained by interposing a thermoelectric element using the Seebeck effect (the effect of generating power using heat), between a CPU and a diffusion cooling heat sink for the CPU, to change the temperature of the thermoelectric element.

This structure, however, has a thermal resistance between the CPU and the heat sink, thereby significantly reducing the effect of cooling the CPU. A structure for using a fan to cool a diffusion side of the heat sink has also been disclosed. In this case, however, the thermoelectric element is cooled via the heat sink, so that only a small difference occurs between a heated side of the thermoelectric element which is in contact with the CPU and a cooled side thereof which is in contact with the heat sink. Accordingly, only a small electromotive force is obtained through heat generation, and the extent to which this power is reused within the equipment is limited. As a result, this structure is still disadvantageous in the power generation efficiency and the reuse of power.

In view of the above described points, it is an object of the present invention to provide a power generating mechanism that efficiently obtains electric energy using thermal energy from a heat generating component provided in electronic equipment. It is another object to provide a computer apparatus and electronic equipment that can use energy more efficiently by reusing electric energy generated by the power generating mechanism.

SUMMARY OF THE INVENTION

To attain the above objects, according to one aspect of the present invention, there is provided a power generating mechanism for electronic equipment having a heat generating component inside, the mechanism comprising a diffusion member kept in contact with the heat generating component to diffuse heat generated by the heat generating component, a thermoelectric conversion module having one side kept in contact with the diffusion member, and a cooling device for cooling the other side of the thermoelectric conversion module.

In the power generating mechanism configured as described above, the diffusion member, formed of a high-heat-conductivity material such as aluminum, is in contact with the heat generating component provided in the electronic equipment, thereby diffusing heat generated by the heat generating component to improve the effect of cooling components.

The thermoelectric conversion module has the one side kept in contact with the diffusion member so as to be heated using heat emitted from the diffusion member. In addition, the other side of the thermoelectric conversion module is cooled by the cooling device.

Thus, a large difference in temperature (a difference in thermal energy) occurs between the opposite sides of the thermoelectric conversion module to increase an electromotive force (electric energy) generated by the thermoelectric conversion module. Additionally, since the thermoelectric conversion module is heated via the diffusion module, excess emitted heat (loss energy) can be absorbed without preventing the heat generating component from being cooled, thereby enabling efficient power generation (energy conversion).

Electronic equipment that already includes the diffusion member or cooling device to cool the heat generating component is preferred because this existing diffusion member or cooling device can be used for the above described effect. In addition, the diffusion member may comprise a heat sink that is shaped like a plate or has a plurality of diffusion fins, and the heat generating component may comprise a semiconductor device for actuating the electronic equipment or a heat generating component on an electric circuit (a transformer or a coil).

The thermoelectric conversion module may be configured by generating electricity using a difference in temperature between one side and the other side thereof, and may comprise a module for activating movement of electrons via dynamic energy or chemical reaction resulting from thermal energy to thereby generate electric energy (generate power).

The thermoelectric conversion module and the heat generating component may be located substantially symmetrically with respect to the diffusion member. If the thermoelectric conversion module and the heat generating component are located substantially symmetrically with respect to the diffusion member, that is, the thermoelectric conversion module is located close to the heat generating component, the one side of the thermoelectric conversion module becomes hotter.

Alternatively, according to another aspect of the present invention, there is provided a power generating mechanism for electronic equipment having a heat generating component inside, the structure comprising a duct having an outside surface kept in contact with the heat generating component to diffuse heat generated by the heat generating component, a thermoelectric conversion module located inside the duct and having one side kept in contact with an inside surface of the duct, and a fan for ventilating an interior of the duct to cool the other side of the thermoelectric conversion module.

In this power generating mechanism, the heat generating component provided in the electronic equipment is in contact with the outside surface of the duct formed of a high-heat-conductivity material such as aluminum, so that the thermoelectric conversion module, located inside the duct in such a manner that the one side thereof is in contact with the inside surface of the duct, has the other side cooled by the fan for ventilating the interior of the duct.

Thus, the thermoelectric conversion module has the one side heated by heat emitted from the duct and the other side directly cooled by means of ventilation by the fan, so that a large difference in temperature occurs between the opposite sides of the thermoelectric conversion module to increase an electromotive force generated by the thermoelectric conversion module.

Since this thermoelectric conversion module is also heated via the duct, power can be efficiently generated using heat while absorbing excess emitted heat without reducing the effect of cooling the heat generating component.

Since this thermoelectric conversion module and the heat generating component are also located substantially symmetrically with respect to the portion of the thermoelectric conversion module which is in contact with the duct, the one side of the thermoelectric conversion module becomes hotter.

According to an alternative aspect of the present invention, there is provided a power generating mechanism for electronic equipment having an internal structural member with a heat generating component disposed near the structural member, the mechanism comprising a thermoelectric conversion module having one side kept in contact with the heat generating component and the other side kept in contact with the structural member.

In this power generating mechanism, the thermoelectric conversion module has the one side kept in contact with the heat generating component, while having the other side kept in contact with a chassis or the like formed of a high-heat-conductivity material such as aluminum to facilitate cooling. This configuration can cause a large difference in temperature between the opposite surfaces of the thermoelectric conversion module to provide a large electromotive force. In addition, since the above described cooling device or fan is not used, power consumption can be reduced, and since the diffusion member or duct is not required, an increase in costs is prevented.

Where the power generating mechanism is employed in the main body of a computer apparatus or the like comprising a keyboard unit disposed in the main body, the heat generating component may be a heat generating element that is related to the CPU (for example, CPU controller) or that is a component. The structural member may be a keyboard support plate or the like for supporting the keyboard unit.

Alternatively, according to a further aspect of the present invention, there is provided a power generating mechanism for electronic equipment having an internal heat generating component, the mechanism comprising a heat pipe having one end in contact with the heat generating component to transmit heat generated thereby, a thermoelectric conversion module having one side kept in contact with the other side of the heat pipe and a cooling device for cooling the other side of the thermoelectric conversion module.

This power generating mechanism uses the heat pipe to improve the effect of cooling the heat generating component, and the heat pipe has the one end kept directly or indirectly in contact with the heat generating component to transmit much of loss heat from the heat generating component to the heat pipe.

The thermoelectric conversion module in contact with the other end of the heat pipe has the one side heated by means of conduction heat from the heat pipe and the other side cooled by the cooling device.

Consequently, the thermoelectric conversion module heated via the heat pipe can also efficiently generate power using heat based on the large difference in temperature between the opposite sides thereof and without preventing the heat generating component from being cooled.

Alternatively, according to one aspect of the present invention, there is provided a power generating mechanism for electronic equipment having a heat generating component inside, the mechanism comprising a duct having an outside surface kept in contact with the heat generating component to diffuse heat generated by the heat generating component, a heat pipe having one end connected to a neighborhood of the portion of the duct which is in contact with the heat generating component, to transmit heat generated by the heat generating component, a thermoelectric conversion module having one side kept in contact with the other end of the heat pipe and the other side kept in contact with a diffusion section of the duct, and a fan for ventilating an interior of the duct to cool the diffusion section.

In this power generating mechanism, the duct has its outside surface kept in contact with the heat generating component and has the one end of the heat pipe connected to the neighborhood of the portion of the duct which is in contact with the heat generating component, to transmit heat generated by the heat generating component.

The thermoelectric conversion module has the one side kept in contact with the other end of the heat pipe and the other side kept in contact with the diffusion section of the duct cooled by the fan, thereby improving the cooling effect on the other side to provide a large electromotive force.

In addition, the duct and heat pipe and the fan cooperate in providing a higher diffusion effect, thereby preventing the cooling effect on the heat generating component from being adversely affected.

Alternatively, the other end of the heat pipe, with which the thermoelectric conversion module is kept in contact, may be shaped like a substantially rectangular pipe. This configuration facilitates mounting of the thermoelectric conversion module. It also has a larger surface area than pipes with a circular cross section or the like, thereby enabling more thermoelectric conversion modules to be mounted.

Alternatively, the thermoelectric conversion module may be a thermoelectric element module using the Seebeck effect. This thermoelectric element module is obtained by arranging and assembling a plurality of semiconductor devices together as a module, thereby enabling the shape of the module to be changed depending on a mounting site. Furthermore, this module can be configured to be small and light and is thus preferably employed in portable equipment.

In addition, in a computer apparatus with the above described power generating mechanism, an electromotive force generated by the thermoelectric conversion module may be used as power for driving one or more designated components of the apparatus. Accordingly, the computer apparatus has an improved energy efficiency.

The designated component(s) may be a drive section such as the above described fan, an illumination section such as LEDs, as well as other logic and subsystems.

Alternatively, this computer apparatus may comprise a power source switching module for switching between the electromotive force generated by the thermoelectric conversion module and power supplied by a main power to drive the designated component(s), depending on the level of the electromotive force from the thermoelectric conversion module.

When the electromotive force from the thermoelectric conversion module becomes lower than a preset threshold, this power source switching module switches the power source so that main power can drive each designated component. As a result, each designated component or the entire computer apparatus can be actuated in a stable way.

Alternatively, according to one aspect of electronic equipment with the above described power generating mechanism, an electromotive force generated by the thermoelectric conversion module may be used as power for driving designated components(s) of the equipment. Accordingly, the electronic equipment has an improved energy efficiency.

Alternatively, this electronic equipment may comprise a power source switching module for switching between the electromotive force generated by the thermoelectric conversion module and power supplied by a main power to drive each designated component, depending on the level of the electromotive force from the thermoelectric conversion module.

Again, when the electromotive force from the thermoelectric conversion module becomes lower than a preset threshold, the power source switching module switches the power source so that a main power can drive each component. As a result, the entire equipment can be operated in a stable manner.

Embodiments of the present invention will be described below with reference to the drawings.

BRIEF DESCRIPTION OF THE DRAWINGS

FIG. 1 is a schematic view showing a notebook PC according to a first embodiment of the present invention;

FIG. 2 is a perspective view showing the internal structure of the notebook PC in FIG. 1 and a power generating mechanism;

FIG. 3 is a schematic sectional view showing the power generating mechanism according to the first embodiment of the present invention;

FIG. 4 is a schematic configuration diagram of a Seebeck element module according to the first embodiment of the present invention;

FIG. 5 is a block diagram showing the configuration of a power source section according to the first embodiment of the present invention;

FIG. 6 is a timing chart showing switching control for a power source executed by a power management controller in FIG. 4;

FIG. 7 is a perspective view showing the internal structure of a notebook PC and a power generating mechanism according to a second embodiment of the present invention;

FIG. 8 is a perspective view showing the power generating mechanism according to the second embodiment of the present invention;

FIG. 9 is a side sectional view of the power generating mechanism in FIG. 8;

FIG. 10 is a side view of the power generating mechanism in FIG. 8 as seen from an exhaust port in a CPU cooler; and FIG. 11 is a perspective view useful in explaining how a Seebeck element module is mounted in a heat pipe of the power generating mechanism in FIG. 8.

DETAILED DESCRIPTION OF THE INVENTION

FIGS. 1 and 2 show a notebook personal computer 10 (hereafter referred to as a "notebook PC 10") according to a first embodiment of the present invention. As shown in FIG. 1, a PC main body 12 of the notebook PC 10 has a keyboard unit 14 disposed on a top surface thereof and a liquid crystal display (LCD) unit 16 axially supported at a substantially rear edge thereof for rotational movement.

In addition, as shown in FIG. 2, the PC main body 12 internally has a CPU card 24 having a CPU 20, CPU controller 22, and the like mounted thereon, a CPU cooler 26 mounted on the CPU card 24 in a fashion forming a unit in order to cool the CPU 20, a mother board 28 having a memory, a controller chip, and the like mounted thereon, and peripherals including storage devices such as a hard disc drive (HDD) 30, a floppy disc drive (FDD), not shown, and a CD-ROM drive.

The notebook PC 10 according to this embodiment includes a power generating mechanism 40 principally comprising the CPU 20 and CPU cooler 26 of the CPU card 24 and Seebeck element module 60A, and a power generating mechanism 41 mainly comprising CPU controller 22 of the CPU card 24, keyboard unit 14 and Seebeck element module 60B. These power generating mechanisms will be explained below in detail.

The CPU cooler 26 of the power generating mechanism 40 comprises a duct-shaped heat sink 42 made of aluminum or the like and a fan unit 44 incorporated in the heat sink 42 for ventilating an interior of the heat sink 42; the CPU cooler 26 is mounted on the CPU card 24 with screws, not shown, in a fashion forming a unit.

In the unit shown in FIG. 3, a bottom surface of the heat sink 42 is directly in abutment with a top surface of the CPU 20 or via a cushion material (not shown) such as a silicone rubber which has a high heat conductivity. Thus, heat generated by the CPU 20 moves directly or via the cushion material to the heat sink 42 due to heat conduction, so that the heat generated by the CPU 20 is held in the heat sink 42.

The fan unit 44 transfers air from a suction port 46 drilled in the bottom surface of the heat sink 42 to an exhaust port 48 formed in a side surface of the heat sink 42, to cool the heat sink 42 and then exhaust the air through an exhaust section 50 (a plurality of slits) formed in a right side of an enclosure 13 of the PC main body 12.

The CPU card 24 has a hole 25 (see FIG. 2) drilled in a site corresponding to the suction port 46 in the heat sink 42, the hole 25 being shaped substantially like a square and being slightly larger than the suction port 46, so that air from an interior of the PC main body 12 is sucked into the suction port 46 through the hole 25.

As a result, emission of heat (the radiation effect) held in the heat sink 42 is facilitated to enhance the effect of cooling the CPU 20 to thereby prevent malfunction (an increase in error rate or the like).

In addition, the heat sink 42 has a Seebeck element module 60A mounted in a duct thereof for generating power using heat generated by the CPU 20.

The Seebeck element module 60A comprises n-type semiconductors 66 and p-type semiconductors 68 alternately arranged between insulators 62 and 64 of an aluminum or a ceramic substrate or the like in such a manner that each of the n-type semiconductors 66 and a corresponding one of the p-type semiconductors 68 are electrically connected in series via an electrode 70 (a II coupling) as shown in FIG. 4.

When the Seebeck element module 60A is subjected to a difference in temperature by using the insulator 62 on a heated side (a hot-temperature side) while using the insulator 64 on a cooled side (a low-temperature side), heat (heat energy) conducted from the insulator 62 to the insulator 64 causes electrons in each n-type semiconductor 66 and holes in each p-type semiconductor 68 to migrate to the insulator 64 on the cooled side, thereby generating electromotive forces in the electrodes 70 at the opposite ends of each n-type semiconductor 66 and the corresponding p-type semiconductor 68 electrically connected in series (the Seebeck effect).

By using this Seebeck element module 60A using the Seebeck effect and locating it near a heat source, power can be generated using heat i.e. heat energy is converted into electric energy.

Thus, in this embodiment, the Seebeck element module 60A has the insulator 62 side kept in contact with a duct bottom surface 42A of the heat sink 42, while having the insulator 64 side exposed inside the duct (see FIG. 3). Additionally, the Seebeck element module 60A is located generally immediately above the CPU 20 via the heat sink 42 (that is, the Seebeck element module 60A and the CPU 20 are substantially symmetrical) and bonded to the heat sink 42 with an adhesive of a high heat conductivity. The Seebeck element module 60A can also be mounted with an adhesive sheet of a high heat conductivity instead of the adhesive.

On the other hand, in the power generating mechanism 41, a Seebeck element module 60B has its heated side (the insulator 62) bonded to a top surface of CPU controller 22 using the above described adhesive. While the keyboard unit 14 is mounted in the enclosure 13, the Seebeck element module 60B has its cooled side (the insulator 64) abutted on a recess 15A formed in a support plate 15 (made of aluminum) for the keyboard unit 14 via a cushion material 74 such as a silicone rubber which has a high heat conductivity (see FIG. 3).

In addition, the Seebeck element modules 60A and 60B are each configured so as to have a Seebeck coefficient $\alpha = V/\Delta T = 0.20$ mV/° C., a cross section of 0.5×0.5 mm, an interelectrode gap of 0.3 mm, and 710 submodules (this number is denoted by N) (L: 30 mm×W: 30 mm×t: 3 mm).

In FIGS. 2 and 3, illustration of harnesses and the like which electrically connect the Seebeck element modules 60A and 60B to a power source section are omitted for clarity.

Next, a configuration will be described which reuses for the notebook PC 10 power generated by the power generating mechanisms 40 and 41 according to this embodiment. FIG. 5 shows a block diagram of a power source section 80 of the notebook PC 10.

An electromotive force (VccTE) generated by subjecting the Seebeck element modules 60A and 60B to a difference in temperature is input to a hybrid boost DC/DC converter 82. If, for example, an electromotive force of 750 mA at 1V obtained by means of thermal power generation is input to a hybrid boost DC/DC converter, an output of 120 mA at 5V is obtained.

An output (VccTEP5) from the hybrid boost DC/DC converter 82 is input to the fan unit 44 or a LED 88 and a keyboard illumination light 90 through a voltage level controller 84 and a power management controller 86, thereby operating each block.

In this case, the power management controller 86 switches between power (Vcc5M) from a main power 92 (an AC adapter or a battery) and an electromotive force (VccTE) from the thermal-power-generating power source (the Seebeck element modules 60A and 60B) for control.

The power management controller 86 monitors the electromotive force (VccTE) obtained by means of the thermal power generation and the output (VccTEP5) from the hybrid boost DC/DC converter 82, and switches a gate (G) of a FET (a field effect transistor) 93 from the Vcc5M to the VccTEP5 for control when a stable supply is detected.

FIG. 6 shows a timing chart of power supply switchings. The VccTE and the VccTEP5 are monitored and the VccTEP5 is switched to the Vcc5M when the VccTE has a voltage level between 0.8 and 0.9V. Thus, if the VccTE obtained by means of the thermal power generation has a voltage level lower than 0.9V, the power is switched to the Vcc5M from the main power to continue the power supply to thereby stabilize the operation of each block.

The electromotive force generated by means of the thermal power generation can be used for a logic 94 and a subsystem 96.

Next, the operation of this embodiment will be explained. In the power generating mechanism 40, heat generated by the CPU 20 is emitted via the heat sink 42 of the CPU cooler 26, so that the emitted heat is applied to the heated side of the Seebeck element module 60A. In addition, since the Seebeck element module 60A has its cooled side cooled by means of ventilation by the fan unit 44, a large difference in temperature occurs between the heated side and the cooled side. Results of measurements of the power generating mechanism 40 according to this embodiment indicate that the Seebeck element module 60A has a difference in temperature $\Delta T1 = 3°$ C.

In addition, in the power generating mechanism 41, heat generated by CPU controller 22 directly heats the heated side of the Seebeck element module 60B, while the cooled side is cooled by the support plate 15 of the keyboard unit 14, resulting in a large difference in temperature. Results of measurements of the power generating mechanism 41 according to this embodiment indicate that the Seebeck element module 60B has a difference in temperature $\Delta T2 = 4°$ C.

Consequently, the power generating mechanisms 40 and 41 generate an electromotive force $V = \alpha \times (\Delta T1 + \Delta T2) \times N = 0.20 \times (3+4) \times 710 = 994$ mV (about 1V).

As described above, in the power generating mechanism 40 according to this embodiment, the heat sink 42 is mounted via the CPU card 24 on the CPU 20 provided in the notebook PC 10, to diffuse heat generated by the CPU 20, thereby improving the cooling effect.

The Seebeck element module 60A is mounted in the heat sink 42, and has its heated side (the insulator 62) heated using heat emitted from the heat sink 42, while having its cooled side (the insulator 64) cooled by the fan unit 44.

Thus, a large difference in temperature occurs between the opposite sides of the Seebeck element module 60A to increase the electromotive force. In addition, in this embodiment, the Seebeck element module 60A is heated via the heat sink 42, so that excess emitted heat can be absorbed without preventing the CPU 20 from being cooled, thereby enabling efficient power generation.

Additionally, the Seebeck element module 60A and the CPU 20 are located substantially symmetrically with respect to the heat sink 42 (that is, the Seebeck element module 60A is located substantially immediately above the CPU 20), thereby making the heated side of the Seebeck element module 60A hotter.

Furthermore, the heat sink 42 acts as a duct, the interior of which is air-cooled by the fan unit 44, thereby improving the diffusion effect, that is, the effect of cooling the CPU 20. Since the Seebeck element module 60A is located in the duct, the cooling of the cooled side is facilitated to obtain a large electromotive force.

In the power generating mechanism 41 according to this embodiment, the Seebeck element module 60B mounted on CPU controller 22 is in contact with the support plate 15 of the keyboard unit 14. Accordingly, the Seebeck element module 60B can be subjected to the large difference in temperature between CPU controller 22 and the keyboard unit 14 to obtain a large electromotive force.

In addition, in the notebook PC 10 according to this embodiment, the electromotive force generated by the Seebeck element modules 60A and 60B is used for driving the fan unit 44, lighting the LED 88, and the like, so that the energy efficiency of the entire equipment can be improved to reduce power consumption.

Furthermore, when the electromotive force (VccTE) from the Seebeck element modules 60A and 60B becomes lower than a preset threshold, the power management controller 86 executes switching and controlling such that each block is driven by means of the power (Vcc5M) of the main power 92. Consequently, each block to which the thermally generated power is supplied or the entire notebook PC 10 is operated in a stable manner.

Although this embodiment comprises the two power generating mechanisms to obtain about 750 mA at about 1V, the number of Seebeck element modules can be increased to obtain higher power. If a double number of Seebeck element modules are installed and 1500 mA at 1V or 750 mA at 2V is input to the hybrid boost DC/DC converter, power of 100 mA at 12V can be obtained. With this value, this embodiment can be applied to microcharging such as trickle charging or the like.

Next, a second embodiment of the present invention will be explained. FIG. 7 shows a notebook PC 100 according to the second embodiment of the present invention and power generating mechanisms 110 and 111 provided in the equipment.

The power generating mechanism 111 according to this embodiment has almost the same configuration as the power generating mechanism 41 according to the first embodiment, and description thereof is thus omitted. The same components as described in the first embodiment are denoted by the same reference numerals and their description is also omitted.

The notebook PC 100 is thinner than the first embodiment (the notebook PC 10) and has a slightly different internal layout. The shape of the CPU cooler 120 and the like are changed to accommodate a thin PC main body 102; the power generating mechanism according to the present invention is applied to this thin notebook PC.

As shown in FIGS. 8 to 10, a CPU cooler 120 has a heat sink 122 also shaped like a duct and a suction port 126 drilled in a bottom surface thereof for sucking air using a fan unit 124. Additionally, the CPU cooler 120 has a CPU connection 130 projected from a side surface thereof opposite to that in which an exhaust port 128 is formed.

When the CPU connection 130 is mounted in a CPU card 132 with screws, not shown, a bottom surface of the CPU connection 130 comes in abutment with the top surface of the CPU 20 (see FIG. 9).

In addition, a heat pipe 136 is embedded in a recessed groove 134 with a rectangular cross section which is formed in a top surface of a heat sink 122.

The heat pipe 136 is obtained by forming a metal of a high heat conductivity or the like (for example, copper, nickel, or stainless steel) into a pipe, reducing the pressure of the interior of the pipe to form a closed space, and then pouring pure water or the like into the interior of the pipe as an operating liquid. Accordingly, diffusion occurs in the heat pipe 136 such that the operating liquid is heated and evaporated from a heated end (one end) thereof and then cooled at the opposed cooled end (the other end) and recovered to a liquid. The operating liquid recovered to the liquid is then returned to the heated end and evaporated therefrom. In this manner, the cyclic operation is performed to transport heat.

The operating liquid poured into the heat pipe 136 depends on operating temperature, and for operations in a relatively low temperature zone (300° C. or lower) such as those in this embodiment, for example, water, which is inexpensive and efficient, is suitable as the operating liquid.

In addition, the heat pipe 136 has a heated end 136A shaped like a round pipe and a cooled end 136B shaped like a rectangular pipe, as shown in FIG. 11(A). The cooled end 136B has four Seebeck element modules 60C fixed thereto each on a corresponding side thereof with an adhesive or the like and shaped substantially like bars, as shown in FIG. 11(B).

The heat pipe 135 is embedded in the recessed groove 134 of the heat sink 122 as described previously, and has its heated end 136A fixed by means of press fitting or the like. In addition, in this embedded state, diffusion surfaces of the Seebeck element module 60C located on a bottom surface and opposite side surfaces of the cooled end 136B are in abutment with an inner wall surface of the recessed groove 134 (see FIG. 10).

In this manner, in the power generating mechanism 110 according to this embodiment, heat generated by the CPU 20 is conducted through the heat pipe 136, so that more of lost thermal energy can be provided for the Seebeck element module 60C to enable efficient power generation.

In addition, since the heat pipe 136 is embedded in the heat sink 122 air-cooled by the fan unit 124, the effect of cooling the Seebeck element module 60C is improved.

Furthermore, a portion (the cooled end 136B) of the heat pipe 136 which is mounted on the Seebeck element module 60C is shaped like a rectangular pipe, so that the heat pipe 136 can be easily mounted on the Seebeck element module 60C.

Additionally, in the first and second embodiments, power is thermally generated by using the Seebeck element modules 60A, 60B, and 60C each obtained by arranging and assembling a plurality of semiconductor devices to form a module. Consequently, the shapes of the Seebeck element modules can be easily changed depending on the embodiment. This is particularly preferable for electronic equipment such as notebook PCs which are limited in space.

Even in the notebook PC 100 according to the second embodiment, power obtained by the power generating mechanism can be supplied to each block as in the first embodiment and the power generating mechanism and the main power can be mutually switched for control, thereby stabilizing operations.

The power generating mechanism according to the present invention is applicable to battery-driven notebook PCs and any electronic equipment with a heat generating source whether portable or not or whether AC or DC power source driven. Furthermore, the equipment more preferably comprises a device for cooling the heat generating source.

Since the power generating mechanism according to the present invention is configured as described above, electric energy can be efficiently obtained using thermal energy from the heat generating component provided in the electronic equipment. In addition, in the computer apparatus and electronic equipment with the power generating mechanism configured as described above, the electric energy generated by the power generating mechanism can be reused in the equipment to improve the energy efficiency.

What is claimed:

1. A power generating mechanism for electronic apparatus having a heat generating component, comprising:
   a duct having an outside surface in thermal contact with said heat generating component to diffuse heat generated by the heat generating component;
   a thermoelectric conversion module located inside said duct and having one side in contact with an inside surface of the duct; and
   a fan for ventilating an interior of said duct to cool the other side of said thermoelectric conversion module.

2. The power generating mechanism according to claim 1, wherein said thermoelectric conversion module and said heat generating component are located substantially symmetrically with respect to the portion of the thermoelectric conversion module which is in contact with said duct.

3. A power generating mechanism for electronic equipment having a heat generating component inside, comprising:
   a heat pipe having one end in contact with said heat generating component to transmit heat generated thereby;
   a thermoelectric conversion module having one side in contact with the other end of said heat pipe; and
   a cooling device for cooling the other side of said thermoelectric conversion module.

4. The power generating mechanism according to claim 3, wherein said other end of said heat pipe is shaped like a substantially rectangular pipe.

5. A power generating mechanism for electronic equipment having a heat generating component inside, comprising:
   a duct having an outside surface in contact with said heat generating component to diffuse heat generated thereby;
   a heat pipe having one end connected to a neighborhood of the portion of said duct which is in contact with said heat generating component;
   a thermoelectric conversion module having one side kept in contact with the other end of said heat pipe and the other side kept in contact with a diffusion section of said duct; and
   a fan for ventilating an interior of said duct to cool said diffusion section.

6. Electronic apparatus comprising:
   a heat generating component;
   a diffusion member heat sink in thermal contact with the heat generating component to diffuse heat generated by the heat generating component;
   a thermoelectric conversion module having one side in contact with said diffusion member heat sink; and
   a cooling device for cooling another side of said thermoelectric conversion module;
   wherein an electromotive force generated by said thermoelectric conversion module is used as power for driving one or more components of the apparatus a power source switching module for switching between the electromotive force generated by said thermoelectric conversion module and power supplied by a main power to drive said one or more components, depending on the level of said electromotive force.

7. A computer system comprising:
   a CPU;
   a heat sink in thermal contact with the CPU to diffuse heat generated by the CPU;
   a thermoelectric conversion module having one side in contact with the heat sink; and
   a fan for cooling another side of said thermoelectric conversion module;
   wherein an electromotive force generated by said thermoelectric conversion module is used as power for driving one or more components of the apparatus a power source switching module for switching between the electromotive force generated by said thermoelectric conversion module and power supplied by a main power to drive said one or more components, depending on the level of said electromotive force.

8. A computer system comprising:
   a CPU;
   a duct having an outside surface in thermal contact with said CPU to diffuse heat generated by the CPU;
   a thermoelectric conversion module located inside said duct and having one side in contact with an inside surface of the duct; and a fan for ventilating an interior of said duct to cool the other side of said thermoelectric conversion module.

* * * * *